United States Patent
Leng

(10) Patent No.: US 12,469,712 B2
(45) Date of Patent: Nov. 11, 2025

(54) METHOD FOR MANUFACTURING TRENCH IN SEMICONDUCTOR SUBSTRATE, AND SEMICONDUCTOR DEVICE

(71) Applicant: GTA SEMICONDUCTOR CO., LTD., Shanghai (CN)

(72) Inventor: Guoqing Leng, Shanghai (CN)

(73) Assignee: GTA SEMICONDUCTOR CO., LTD., Shanghai (CN)

( * ) Notice: Subject to any disclaimer, the term of this patent is extended or adjusted under 35 U.S.C. 154(b) by 0 days.

(21) Appl. No.: 19/116,142

(22) PCT Filed: Sep. 27, 2023

(86) PCT No.: PCT/CN2023/122053
§ 371 (c)(1),
(2) Date: Mar. 27, 2025

(87) PCT Pub. No.: WO2024/067703
PCT Pub. Date: Apr. 4, 2024

(65) Prior Publication Data
US 2025/0259853 A1    Aug. 14, 2025

(30) Foreign Application Priority Data
Sep. 28, 2022 (CN) .......................... 202211191907.1

(51) Int. Cl.
H01L 21/308 (2006.01)
H01L 21/02 (2006.01)
(Continued)

(52) U.S. Cl.
CPC ...... *H01L 21/308* (2013.01); *H01L 21/02675* (2013.01); *H01L 21/02678* (2013.01);
(Continued)

(58) Field of Classification Search
None
See application file for complete search history.

(56) References Cited

U.S. PATENT DOCUMENTS 9,076,860 B1    7/2015  Lei et al.

FOREIGN PATENT DOCUMENTS

| CN | 103946959 A | 7/2014 |
| CN | 108022831 A | 5/2018 |

(Continued)

OTHER PUBLICATIONS

S. Franssila, "Optical Lithography", in Introduction to Microfabrication, 2nd edition, published by John Wiley & Sons, pp. 103-104. (Year: 2010).*

*Primary Examiner* — Jiong-Ping Lu
(74) *Attorney, Agent, or Firm* — The Webb Law Firm

(57) ABSTRACT

A method for manufacturing a trench in a semiconductor substrate, and a semiconductor device are provided. The method includes: providing the semiconductor substrate; forming a hard mask layer on the semiconductor substrate, performing exposure and development to etch the hard mask layer and the semiconductor substrate to form a trench in the semiconductor substrate, the trench having a side surface and a bottom surface with an angle therebetween being greater than 90 degrees; irradiating the trench with a laser beam, such that a semiconductor material of a part of the semiconductor substrate within a first distance from the side surface or the bottom surface of the trench is melted; and cooling the semiconductor substrate, such that at least one of the side surface or the bottom surface of the trench is re-shaped to have a lower surface roughness than before.

7 Claims, 7 Drawing Sheets

(51) Int. Cl.
*H01L 21/324* (2006.01)
*H01L 21/67* (2006.01)

(52) U.S. Cl.
CPC ...... *H01L 21/0268* (2013.01); *H01L 21/3247* (2013.01); *H01L 21/6715* (2013.01)

(56) References Cited

FOREIGN PATENT DOCUMENTS

| | | | | |
|---|---|---|---|---|
| CN | 108022831 | * | 11/2018 | ........... H01L 21/268 |
| CN | 112002638 | * | 11/2020 | ......... H01L 21/3081 |
| CN | 112002638 A | | 11/2020 | |
| CN | 112599637 A | | 4/2021 | |
| CN | 113838857 A | | 12/2021 | |
| CN | 114334621 A | | 4/2022 | |
| CN | 111128703 B | | 8/2022 | |
| CN | 115458400 A | | 12/2022 | |
| KR | 20060127593 | * | 12/2006 | ......... H01L 21/0223 |
| KR | 1020060127593 A | | 12/2006 | |

* cited by examiner

METHOD FOR MANUFACTURING TRENCH IN SEMICONDUCTOR SUBSTRATE, AND SEMICONDUCTOR DEVICE

CROSS-REFERENCE TO RELATED APPLICATION

This application is the United States national phase of International Patent Application No. PCT/CN2023/122053, filed Sep. 27, 2023, and claims priority to Chinese Patent Application No. 202211191907.1, filed Sep. 28, 2022, the disclosures of which are hereby incorporated by reference in their entireties.

BACKGROUND OF THE INVENTION

Field of the Invention

The present disclosure relates generally to the field of semiconductors, and more particularly, to a method for manufacturing a trench in a semiconductor substrate, and a semiconductor device.

Description of Related Art

In semiconductor integrated circuits and semiconductor devices such as semiconductor photonic/optoelectronic devices, it is usually necessary to etch trenches on a semiconductor substrate. The trenches obtained by etching may be used as cell structures of trench-type devices (e.g., gate-controlled devices such as metal-oxide-semiconductor field effect transistors (MOSFETs) or insulated gate bipolar transistors (IBGTs)), and may also be used as key components of optical waveguides in semiconductor photonic/optoelectronic devices.

However, the trench obtained by etching often has a large surface roughness on its side surface or bottom surface. In severe cases, even spaced stripes may be seen at the side surface or the bottom surface of the trench, which will seriously deteriorate the performance of the semiconductor device. For example, this may cause problems such as serious gate oxide leakage and low reliability in trench-type gate-controlled devices, and may also cause problems such as increased light scattering loss and increased optical waveguide transmission loss in semiconductor photonic/optoelectronic devices.

Therefore, it is desirable to obtain trenches with lower surface roughness.

SUMMARY OF THE INVENTION

According to an aspect of the present disclosure, a method for manufacturing a trench in a semiconductor substrate is provided, including: providing the semiconductor substrate; forming a hard mask layer on the semiconductor substrate, performing exposure and development after forming a photoresist pattern on the hard mask layer to etch the hard mask layer and the semiconductor substrate to form a trench in the semiconductor substrate, the trench having a side surface and a bottom surface with an angle therebetween being greater than 90 degrees, and removing the photoresist pattern; irradiating the trench with a laser beam, such that a semiconductor material of a part of the semiconductor substrate that is at a distance from the side surface or the bottom surface of the trench not exceeding a first distance is melted; and cooling the semiconductor substrate, such that at least one of the side surface or the bottom surface of the trench is re-shaped to have a surface roughness lower than that before the irradiation with the laser beam.

In some embodiments, the laser beam is configured to irradiate the trench in an incident direction parallel to a depth direction of the trench, and an irradiation area of the laser beam is configured to cover the trench in a width direction of the trench.

In some embodiments, irradiating the trench with the laser beam includes causing a single laser beam or a plurality of laser beams to scan the trench at a preset scanning speed in a scanning direction parallel to a length direction of the trench, the scanning being started when a preset delay period of time has elapsed from start of the irradiation.

In some embodiments, when causing the plurality of laser beams to scan the trench at the preset scanning speed in the scanning direction, irradiation areas of every two adjacent laser beams of the plurality of laser beams partially overlap each other in the scanning direction.

In some embodiments, the preset scanning speed is in a range of 100 mm/s to 500 mm/s, and the preset delay period of time is in a range of 700 ns to 900 ns.

In some embodiments, the step of irradiating the trench with the laser beam is performed in an inert gas atmosphere or in a vacuum environment.

In some embodiments, the first distance is in a range of 150 nm to 250 nm.

In some embodiments, after removing the photoresist pattern and before irradiating the trench with the laser beam, the method further includes performing a pull-back process on the hard mask layer to expose top corners on both sides of the trench, and wherein irradiating the trench with the laser beam further includes irradiating the top corners on the both sides of the trench with the laser beam to round the top corners.

In some embodiments, the semiconductor material of the semiconductor substrate includes silicon.

According to another aspect of the present disclosure, a semiconductor device is provided. The semiconductor device includes a semiconductor substrate, and a trench manufactured in the semiconductor substrate according to the method of any embodiment of the foregoing aspect of the present disclosure.

Further features and advantages of the present disclosure will become more apparent from the following detailed description of exemplary embodiments of the present disclosure with reference to the accompanying drawings.

BRIEF DESCRIPTION OF THE DRAWINGS

The foregoing and other features and advantages of the present disclosure will become apparent from the following description of the embodiments of the present disclosure in conjunction with the accompanying drawings. The accompanying drawings, incorporated herein and forming a part of the specification, are further used to explain the principles of the present disclosure and enable those skilled in the art to make and use the present disclosure. In the accompanying drawings.

Figure 1:
FIG. 1 shows a flow chart of a method for manufacturing a trench in a semiconductor substrate according to some embodiments of the present disclosure.

Note that in the embodiments described below, sometimes the same reference numerals are used in common between different drawings to represent the same parts or parts with the same functions, and repeated descriptions therefor are omitted. In some cases, similar numbers and letters are used to represent similar items, so once an item is defined in one drawing, it docs not need to be further discussed with respect to subsequent drawings.

For case of understanding, the position, size, range, etc. of the structures shown in the drawings and the like may not represent the actual position, size, range, etc. Therefore, the present disclosure is not limited to the position, size, range, etc. disclosed in the drawings and the like.

DESCRIPTION OF THE INVENTION

Various exemplary embodiments of the present disclosure will be described in detail below with reference to the accompanying drawings. It should be noted that unless otherwise specifically stated, the relative arrangement of components and steps, numerical expressions and numerical values set forth in these embodiments do not limit the scope of the present disclosure.

The following description of at least one exemplary embodiment is in fact merely illustrative and is in no way intended to limit the present disclosure and its application or use. That is, the structures and methods herein are shown in an exemplary manner to illustrate different embodiments of the structures and methods in the present disclosure. However, those skilled in the art will appreciate that they merely illustrate exemplary ways of the present disclosure that can be implemented, rather than exhaustive ways. In addition, the drawings need not be drawn to scale, and some features may be enlarged to illustrate the details of specific components.

In addition, technologies, methods, and devices known to ordinary technicians in the relevant art may not be discussed in detail, but where appropriate, the technologies, methods, and devices should be considered as part of the specification.

In all examples shown and discussed herein, any specific values should be interpreted as merely exemplary and not as limiting. Therefore, other examples of the exemplary embodiments may have different values.

In order to optimize the surface roughness of the trenches obtained by etching, thermal oxidation processes are often used for smoothening and defects repairing of the trench surface in traditional processes. Taking silicon semiconductor devices as an example, the thermal oxidation process includes oxidizing the silicon semiconductor device in an environment of above 1000 degrees Celsius (° C.) after the trench etching is completed to form a layer of silicon oxide on the trench surface, and then stripping the layer of silicon oxide. This process may be repeated twice or more, and finally a trench with improved surface morphology and state is obtained. Although the thermal oxidation process can repair the trench to a certain extent, it is difficult to effectively deal with the situation where the surface roughness of the trench is large, and its implementation requires precise control of process parameters and relies on relatively expensive equipment. In addition, the thermal oxidation process may further introduce a corresponding thermal budget, which will affect the overall warpage of the semiconductor substrate.

To this end, the present disclosure provides an improved method for manufacturing a trench in a semiconductor substrate, which utilizes a laser annealing process to melt and then cool a thin layer of the semiconductor substrate near the trench surface to reshape the trench surface, thereby obtaining a trench with a small surface roughness. Such a method does not involve a high temperature process or an oxide layer stripping process and has a simple operation and a low cost. The method has a good surface roughness optimization effect regardless of whether the trench surface roughness is large or small in the situation to be dealt with.

The following will describe in detail the method for manufacturing a trench in a semiconductor substrate and the corresponding semiconductor device according to some embodiments of the present disclosure in conjunction with the accompanying drawings. It is understood that the actual method may further include other steps and the actual semiconductor device may further include other components, and in order to avoid blurring the key points of the present disclosure, the other steps/components are not shown in the accompany drawings and are not discussed herein.

FIG. 1 shows a flow chart of a method 100 for manufacturing a trench in a semiconductor substrate according to some embodiments of the present disclosure. FIGS. 2A to 2H respectively show schematic cross-sectional views of a semiconductor device corresponding to steps of the method shown in FIG. 1.

Figure 2A:
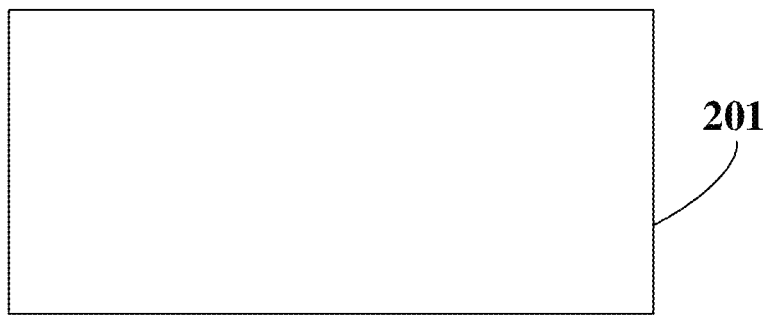
FIGS. 2A to 2H respectively show schematic cross-sectional views of a semiconductor device corresponding to steps of the method shown in FIG. 1.

As shown in FIG. 1 and FIG. 2A, the method 100 may include: at step S102, providing a semiconductor substrate 201. As shown in FIG. 2A, for convenience of description, an x-y plane is used to indicate a plane parallel to a surface of the semiconductor substrate 201, and a z direction is used to indicate a direction perpendicular to the surface of the semiconductor substrate 201. The semiconductor substrate 201 may include any suitable semiconductor material, which may include, for example, a unitary semiconductor material (such as silicon or germanium) or a compound semiconductor material (such as at least one of silicon carbide, silicon germanium, gallium arsenide, gallium phosphide, indium phosphide, indium arsenide or indium antimonide) or a combination thereof. Part or all of the semiconductor substrate 201 may also be doped with impurity elements of a certain concentration, for example, may be doped with N-type or P-type impurities. In the embodiments according to the present disclosure, there is no particular limitation on the semiconductor substrate, as long as it is suitable for reshaping its trench surface by the laser annealing process according to the present disclosure, in other words, as long as the trench surface can be irradiated by a suitable laser beam configured so that a thin layer (for example, its depth may be approximately on the order of hundreds of nanometers (nm)) of the semiconductor substrate near the trench surface can be melted and the trench surface can be reshaped after cooling. For the purpose of illustration, in the following description, a silicon-based semiconductor substrate 201 with a semiconductor material including silicon is taken as a non-limiting example.

Figure 2B:
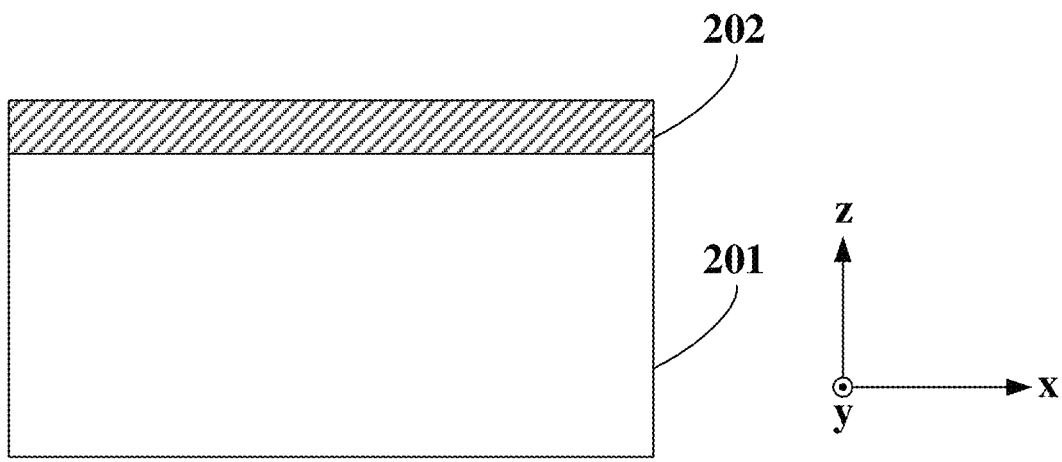

As shown in FIG. 1 and FIG. 2B, the method 100 may include: at step S104, forming a hard mask layer 202 on the semiconductor substrate 201 (for example, it may be formed by deposition (such as but not limited to chemical vapor deposition, etc.) or thermal oxidation growth process, etc.). For example, the hard mask layer 202 may include but not limited to an oxide or a nitride of the semiconductor material or a combinations thereof, such as silicon dioxide and/or silicon nitride, etc. In some embodiments, the hard mask layer 202 may have a single layer or a multilayer structure, for example, it may include a stack of silicon dioxide layer(s) and silicon nitride layer(s). The hard mask layer 202 may have any suitable thickness, for example, its thickness may be between 1 nm and 2 micrometers (µm), or may be between 50 nm and 1 µm, or may be between 100 nm and 500 nm. The melting point of the material of the hard mask layer 202 may be higher than that of the semiconductor material of the semiconductor substrate 201, for example, by more than 100° C., or more than 200° C., or more than 300° C., or more than 400° C., etc. This can help ensure that during the subsequent laser annealing process, when the thin layer (which is not covered by the hard mask layer 202) of the semiconductor substrate 201 near the trench surface is irradiated by the laser beam and melts, a part of the hard mask layer 202 also irradiated by the laser beam and a thin layer of the semiconductor substrate 201 near an upper surface of the substrate and below this part will not melt. Since the unetched part of the upper surface of the semiconductor substrate 201 still maintains a good native interface, it is not necessary to perform a laser annealing process thereon to avoid destroying its good native interface.

Figure 2C:
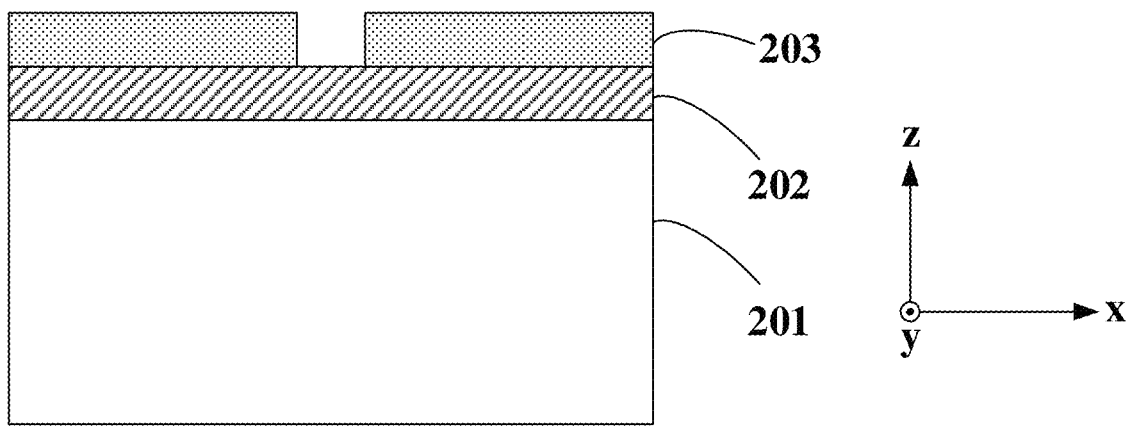

As shown in FIG. 1 and FIG. 2C, the method 100 may include: at step S106, forming a photoresist pattern 203 on the hard mask layer 202. The photoresist pattern 203 may define a position of the trench to be manufactured in the semiconductor substrate 201. The photoresist pattern 203 may be formed on the mask layer 202 by any suitable means such as spin-on coating, spray coating, dip coating, brush coating or evaporation.

Figure 2D:
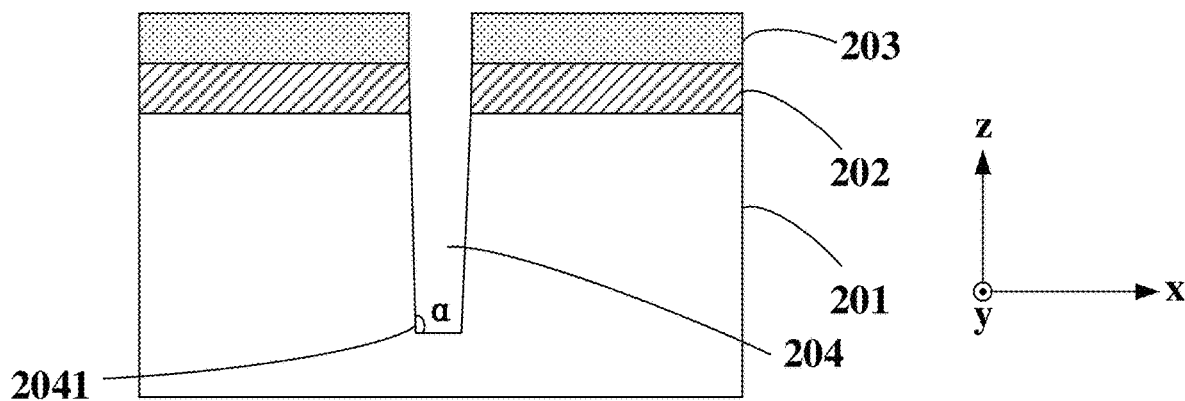

As shown in FIG. 1 and FIG. 2D, the method 100 may include: at step S108, performing exposure and development to etch the hard mask layer 202 and the semiconductor substrate 201 to form a trench 204 in the semiconductor substrate 201, where the trench 204 has a side surface and a bottom surface with an angle (α) 2041 therebetween being greater than 90 degrees. Although only the angle 2041 on one side of the trench 204 is marked with α in the figure, it can be understood that the angle 2041 on the other side of the trench 204 should also be greater than 90 degrees. By making the angle 2041 between the side surface and the bottom surface of the trench 204 greater than 90 degrees, it can be helpful for the laser beam to irradiate both the side surface and the bottom surface of the trench 204 in the subsequent laser annealing process, so that there is no shadow area inside the trench 204. In some embodiments, the angle 2041 between the side surface and the bottom surface of the trench 204 may be greater than 90 degrees and less than or equal to 102 degrees. In some embodiments, a width (a dimension in the x direction) of the trench 204 may be greater than or equal to 0.2 µm, for example, between 0.2 µm and 20 centimeters (cm). A depth (a dimension in the z direction) of the trench 204 to which the method 100 is applicable may depend, for example, on at least one of the power/energy density or the depth of field of the optical radiation of the laser used in the subsequent laser annealing process, etc. The greater the at least one of the power/energy density or the depth of field of the optical radiation of the laser used, the greater the depth of the trench 204 to which the method 100 is applicable. If the trench 204 is formed too deep, the surface near the bottom of the trench 204 may not be effectively melted to be reshaped. In some embodiments, the depth of the trench 204 may be less than or equal to 30 µm. A length (a dimension in the y direction) of the trench 204 to which the method 100 is applicable may depend on a size of the semiconductor substrate 201 (which may be, for example, a 6-inch substrate, an 8-inch substrate, a 12-inch substrate, or a substrate of other size). Although only one trench 204 is shown in the figure, it can be understood that the photoresist pattern 203 may be designed accordingly as needed to form a plurality of trenches 204 in the semiconductor substrate 201.

Figure 2E:
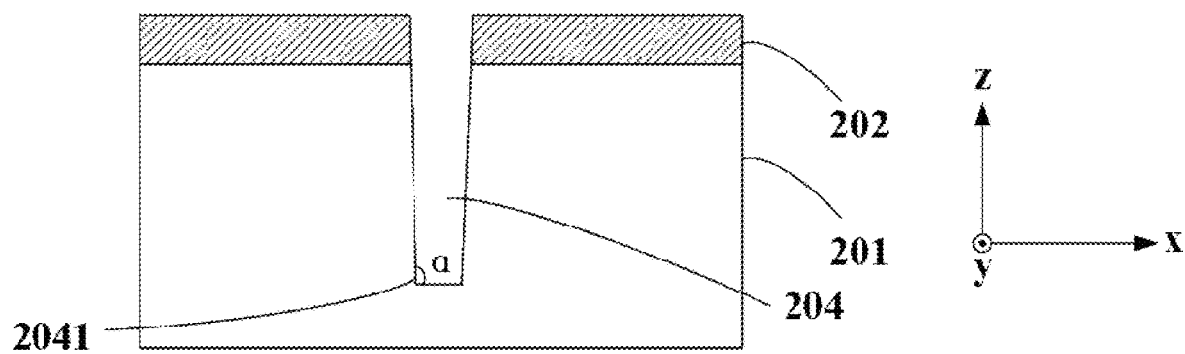

As shown in FIG. 1 and FIG. 2E, the method 100 may include: at step S110, removing the photoresist pattern 203. The photoresist 203 may be removed by any suitable method such as at least one of a dry method or a wet method, and is not particularly limited herein.

Figure 2F:
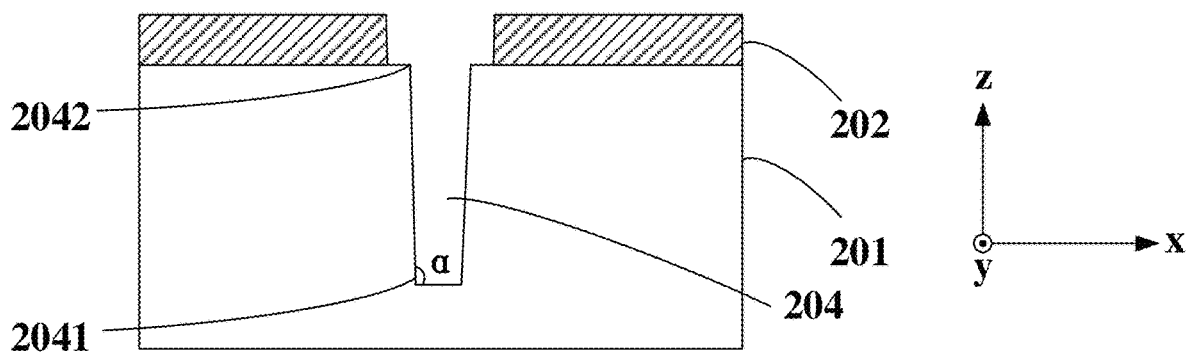

As shown in FIG. 1 and FIG. 2F, the method 100 may include: at step S112, performing a pull-back process on the hard mask layer 203 to expose top corners 2042 on both sides of the trench 204 (angles between the upper surface of the semiconductor substrate 201 and the side surfaces of the trench 204). In some embodiments, a distance by which the hard mask layer 203 is pulled back on each side of the trench 204 may be between 0.3 nm and 1 nm, or between 0.5 nm and 0.8 nm. It should be noted that step S112 is optional and not necessary.

Figure 2G:
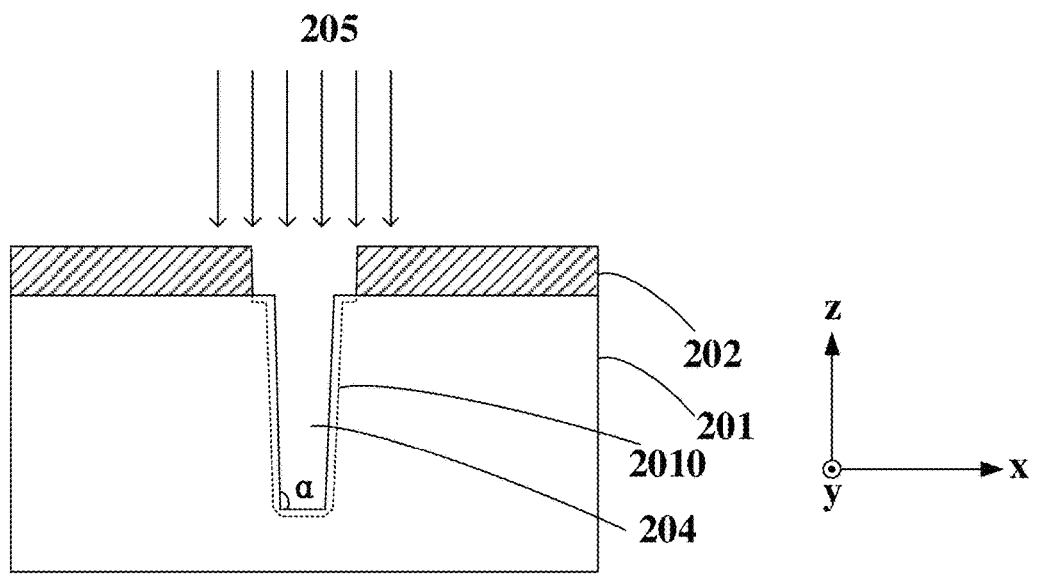

As shown in FIG. 1 and FIG. 2G, the method 100 may include (laser annealing process): at step S114, irradiating the trench 204 with a laser beam 205, such that a semiconductor material of a part 2010 (shown as thin layer surrounded by a dotted line in FIG. 2G) of the semiconductor substrate 201 that is at a distance from the side surface or the bottom surface of the trench 204 not exceeding a first distance is melted; and at step S116, cooling the semiconductor substrate 201, such that at least one of the side surface or the bottom surface of the trench 204 is re-shaped to have a surface roughness lower than that before the irradiation with the laser beam 205. Cooling the semiconductor substrate 201 may, for example, include stopping the irradiation with the laser beam 205, so that the part of the semiconductor substrate 201 that was irradiated by the laser beam 205 is cooled when it is no longer irradiated by the laser beam.

If the first distance is set too small, the melted part at the surface of the trench 204 may not sufficiently flow and exchange to form a good smooth interface; and if the first distance is set too large, the requirement on the power/energy density of the laser is too high, and too much heat applied to the entire semiconductor substrate 201 is prone to affect its overall warpage, etc. In some embodiments, the first distance may be, for example, between 100 nm and 300 nm, or between 150 nm and 250 nm, or, for example, may be about 200 nm.

In some embodiments, the step of irradiating the trench 204 with the laser beam 205 may be performed in an inert gas atmosphere (such as but not limited to nitrogen, helium, etc.), or may be performed in a vacuum environment. This is to avoid water and oxygen and maintain cleanliness, and to prevent the melted part of the semiconductor substrate 201 from being oxidized and/or doped with impurity particles during the laser annealing process.

Any suitable laser may be used to provide the laser beam, as long as its laser wavelength can be absorbed by the semiconductor material of the semiconductor substrate 201 while its power/energy density and its distance from the semiconductor substrate 201 are configured to enable the semiconductor material of the part 2010 of the semiconductor substrate 201 that is at a distance from the side surface or the bottom surface of the trench 204 not exceeding the first distance to melt. For example, for a silicon-based semiconductor substrate 201, a green laser with an energy density of 1.5 joules per square centimeter (J/cm$^2$) to 5.0 J/cm$^2$ may be used.

In some embodiments, the laser beam 205 is configured to irradiate the trench 204 in an incident direction parallel to a depth direction (z direction) of the trench 204. In some embodiments, an irradiation area of the laser beam 205 is configured to cover the trench 204 in a width direction (x direction) of the trench 204. As mentioned above, the hard mask layer 202 can protect the thin layer of the semiconductor substrate 201 near the upper surface thereof and below the hard mask layer 202 from melting even if it is in the irradiation area of the laser beam 205, so that the requirements on the spot size of the laser beam 205 can be not so strict, as long as the trench 204 is covered in the width direction (x direction) of the trench 204. For example, the spot size of the laser beam 205 may be between 2 millimeters (mm) and 4 mm, for example, 3 mm.

If the irradiation area of the laser beam 205 (which may be formed by connecting irradiation areas of multiple laser beams) is large enough to cover the entire trench 204, the entire trench 204 can be processed at the same time. However, such an approach is subject to many limitations, for example, the trench 204 to which the approach is applicable cannot be too wide and/or too long, a combination of too many lasers is required, etc. Therefore, a method of scanning the laser beam may be adopted. In some embodiments, irradiating the trench 204 with the laser beam 205 may include causing a single laser beam or a plurality of laser beams to scan the trench 204 at a preset scanning speed in a scanning direction parallel to a length direction (y direction) of the trench 204, where the scanning is started when a preset delay period of time has elapsed from the start of the irradiation. The method of scanning the laser beam may be effectively applied to wider and/or larger trenches, may also be applied to a case with multiple trenches, and may reduce the number of lasers used. It can be understood that in the case where the trench 204 is irradiated by scanning the laser beam 205, step S114 and step S116 may be performed in a partial overlapping manner. That is, as the laser beam 205 scans through each of a series of positions in the trench 204, the part 2010 of the semiconductor substrate 201 first begins to melt at each of the series of positions in sequence, and later begins to cool at each of the series of positions in sequence (the occurrence of cooling may lag behind the occurrence of melting by several positions). For example, when the laser beam 205 leaves a first position of the series of positions in the trench 204 and scans to a second position of the series of positions in the trench 204, the part 2010 of the semiconductor substrate 201 begins to melt at the second position, while the part 2010 of the semiconductor substrate 201 cools at the first position where the melting has occurred previously.

In some embodiments, the preset delay period of time may be in a range of 700 nanoseconds (ns) to 900 ns, for example, 800 ns. If the preset delay period of time is set too short, the thin layer of semiconductor material at an initial irradiation position of the laser beam 205 may have not been fully melted yet; and if the preset delay period of time is set too long, the operation time may be too long on the one hand, and the semiconductor material in a too deep portion at the initial irradiation position of the laser beam 205 may start to melt undesirably on the other hand.

In some embodiments, the preset scanning speed may be in a range of 100 millimeter per second (mm/s) to 500 mm/s, or in a range of 200 mm/s to 400 mm/s, for example, 300 mm/s. If the preset scanning speed is set too fast, the thin layer of semiconductor material at the irradiation position of the laser beam 205 may have not been fully melted yet; and if the preset scanning speed is set too slow, the operation time may be too long on the one hand, and the semiconductor material in a too deep portion at the irradiation position of the laser beam 205 may start to melt undesirably on the other hand.

In some embodiments, when the plurality of laser beams are caused to scan the trench 204 at the preset scanning speed in the scanning direction (y direction), a wavelength of each of the plurality of laser beams may be the same or different, as long as it is a wavelength that can be absorbed by the semiconductor material of the semiconductor substrate 201. In some embodiments, when the plurality of laser beams are caused to scan the trench 204 at the preset scanning speed in the scanning direction (y direction), a power/energy density of each of the plurality of laser beams may be the same or different, as long as each laser beam alone can cause melting to occur at a corresponding position of the part 2010 of the semiconductor substrate 201 that is at a distance from the side surface or the bottom surface of the trench 204 not exceeding the first distance.

Figure 3:
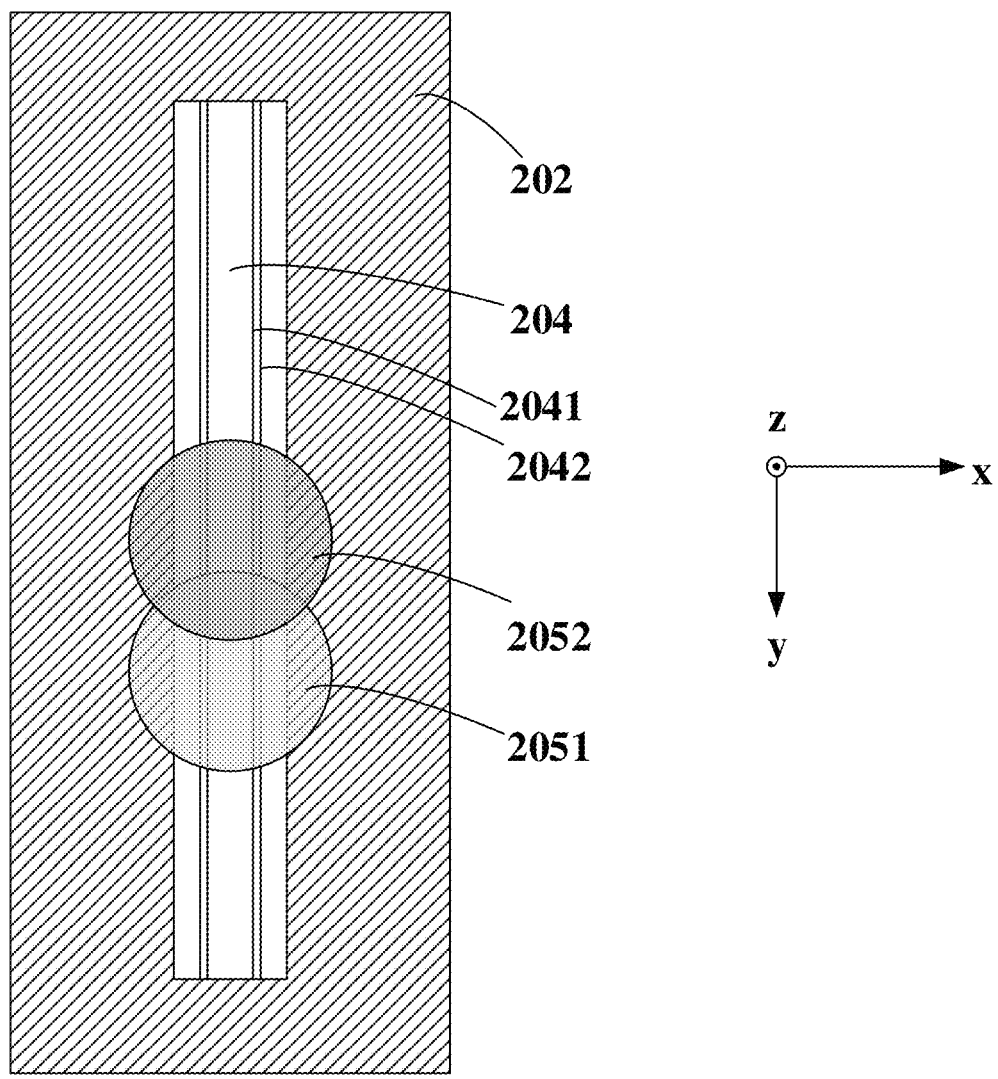
FIG. 3 shows a schematic plane view of a semiconductor device when a trench is irradiated with two laser beams according to some embodiments of the present disclosure.

By synchronous scanning with the plurality of laser beams, the processing time experienced by each position on the side surface or the bottom surface of the trench 204 can be equivalently increased. In this way, the requirement on the power/energy density of a corresponding laser for providing each laser beam can be reduced, and/or the operation time can be shortened. In addition, by synchronous scanning with the plurality of laser beams, the side surface or the bottom surface of the trench 204 may also have better consistency and uniformity after being reshaped by the plurality of laser beams. In some embodiments, when the plurality of laser beams are caused to scan the trench 204 at the preset scanning speed in the scanning direction (y direction), the irradiation areas of every two adjacent laser beams in the plurality of laser beams partially overlap each other in the scanning direction (y direction). As shown in FIG. 3, when the trench 204 is scanned with two laser beams 2051 and 2052, the irradiation area of the laser beam 2051 and the irradiation area of the laser beam 2052 overlap each other in the y direction. By overlapping in this way, the processing time for each position on the side surface or the bottom surface of the trench 204 may be continuous without interruption, so as to avoid significant temperature drop during the process that affects the flow of the melted semiconductor material. It can be understood that although the spot of the laser beam is shown as having a circular shape in FIG. 3, this is only exemplary and not restrictive, and the actual spot may have any suitable shape.

For example, for a silicon-based semiconductor substrate 201, although the melting point of silicon is as high as 1410° C., the laser annealing process is not intended to melt the entire semiconductor substrate 201, but is to melt the silicon material of the part 2010 of the semiconductor substrate 201 that is at a distance from the side surface or the bottom surface of the trench 204 not exceeding the first distance. Therefore, it is sufficient that the silicon material at the surface of the trench 204 can reach about 1200° C. to 1300° C. In addition, by the scanning of the laser beam 205, the laser annealing process may actually cause each position on the side surface or the bottom surface of the trench 204 to be irradiated by the laser beam 205 in turn and reach about 1200° C. to 1300° C., and it is unnecessary to make the entire side surface or bottom surface of the trench 204 reach about 1200° C. to 1300° C., which further reduces the requirements on the power/energy density of the laser providing the laser beam 205. At the same time, such a laser annealing process may be performed at room temperature, which will not cause the entire semiconductor substrate 201 to be at a high temperature, and greatly reduces the influence on the overall warpage of the silicon semiconductor substrate 201.

In some embodiments, the part of the semiconductor substrate 201 that was irradiated by the laser beam 205 can be cooled naturally when it is no longer irradiated by the laser beam, or can be cooled by active cooling (e.g., convection) or passive cooling (e.g., making the semiconductor substrate 201 in thermal contact with a heat sink). Usually, natural cooling is sufficient, which can also reduce process costs. In some examples, the semiconductor substrate 201 can be placed on a metal plate with circulation cooling water flowing therein, so that after a position on the side surface or the bottom surface of the trench 204 is scanned by the laser beam 205 (i.e., the laser beam 205 scans to a next position), the melted semiconductor material at this position can be quickly cooled and solidified to form a better smooth surface.

Figure 2H:
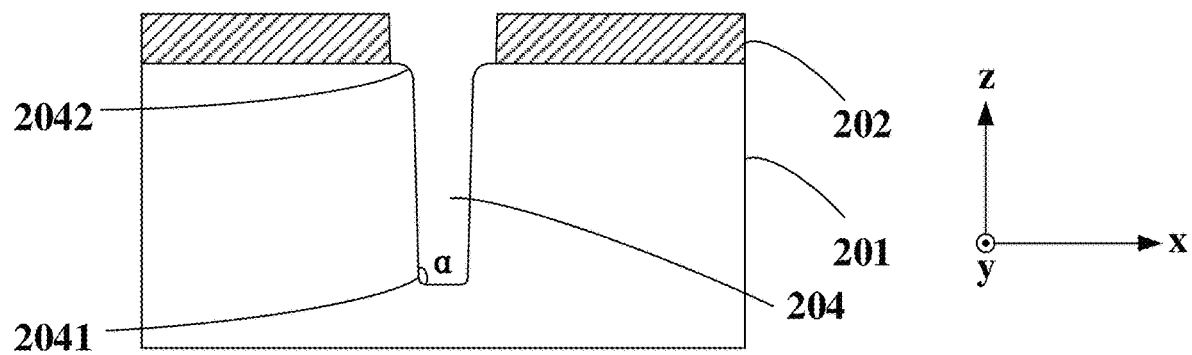

When the optional step S112 is included between steps S110 and S114, irradiating the trench 204 with the laser beam 205 at step S114 further includes irradiating the top corners 2042 on the both sides of the trench 204 with the laser beam 205 to round the top corners 2042, as shown in FIG. 2H. By rounding the top corners 2042 of the trench 204, it is helpful to prevent the top corners 2042 from being too sharp, too sharp corner resulting in stress concentration at the corner which is prone to introducing structural defects and electric field concentration, and thus causing electrical leakage; and it is also beneficial to subsequent processes, such as the filling effect of polysilicon when forming a gate in the trench 204, thereby improving the electrical performance and reliability of the resulted semiconductor device, etc.

Regardless of whether the aforementioned optional step S112 is included between steps S110 and S114 or not, step S114 can round the angle 2041 between the side surface and the bottom surface of the trench 204 (as shown in FIG. 2H), which can also reduce the introduction of defects, prevent electrical leakage, and facilitate subsequent processes, such as the filling effect of polysilicon when forming a gate in the trench 204, thereby improving the electrical performance and reliability of the resulted semiconductor device, etc.

In some embodiments, when a plurality of trenches 204 are formed in the semiconductor substrate 201 by etching, the laser beam 205 may scan each trench 204 one by one. For example, when the plurality of trenches 204 are parallel to each other, the laser beam 205 may scan back and forth on the semiconductor substrate 201 in a serpentine route to traverse each trench 204 in the plurality of trenches 204. In other embodiments, a plurality of laser beams 205 may also be caused to scan the plurality of trenches 204 in parallel.

Figure 4A:
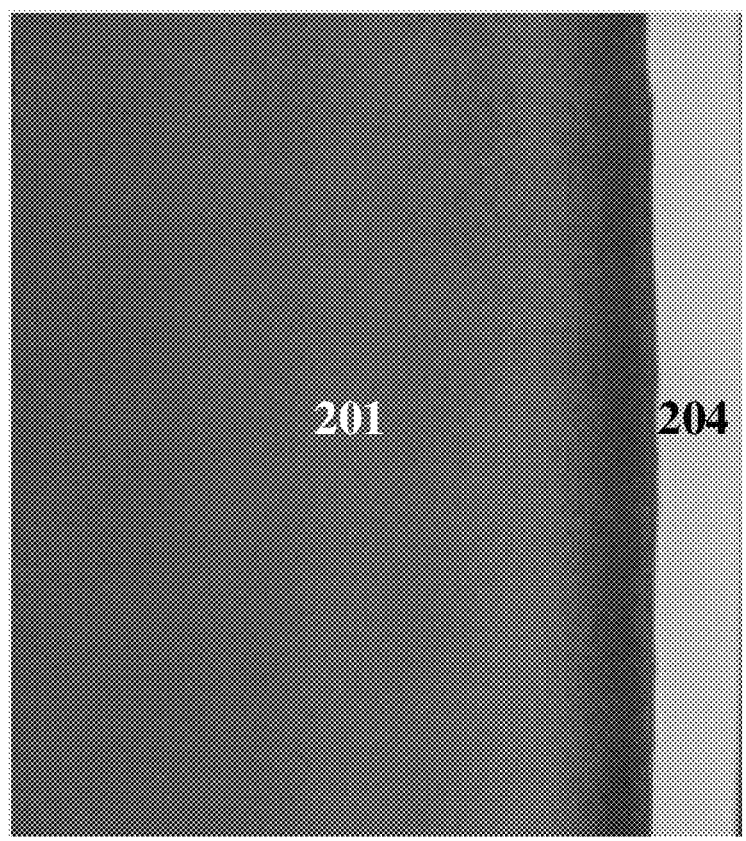
FIG. 4A shows morphology of a side surface of a trench before a laser annealing process is performed.
Figure 4B:
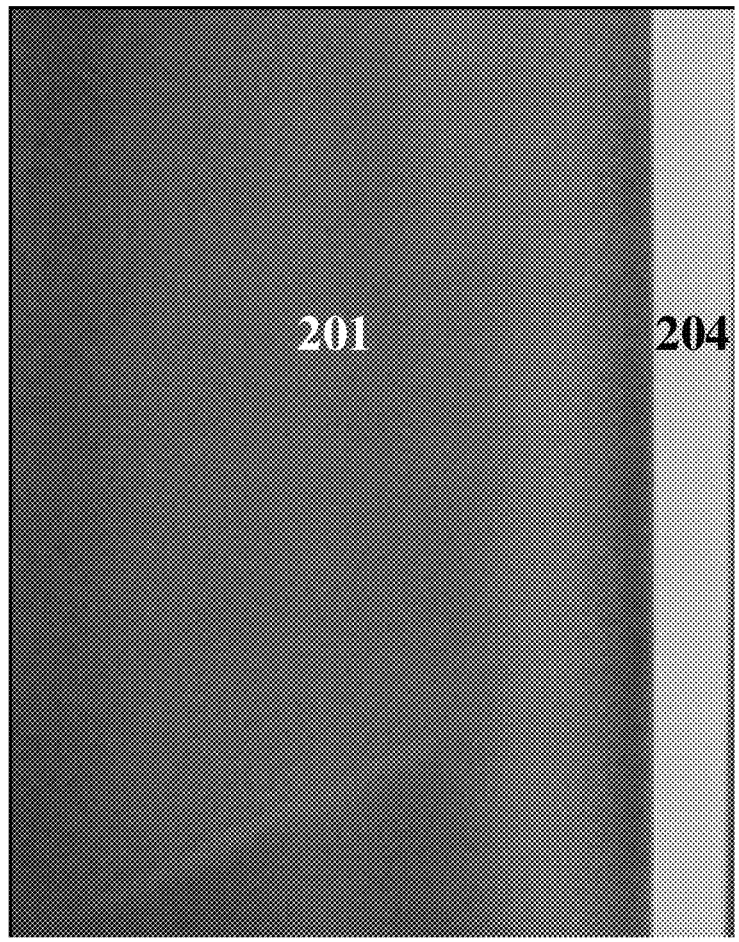
FIG. 4B shows morphology of the side surface of the trench after the laser annealing process is performed.

It can be understood that FIGS. 2A to 2H are only schematic diagrams, and do not clearly show the change in the surface roughness of the trench 204 before and after the laser annealing process. In this regard, reference may be made to FIGS. 4A and 4B, which respectively show the morphology of the side surface of the trench before and after the laser annealing process is performed on the trench in the silicon semiconductor substrate using a green laser beam of 3 $J/cm^2$. It can be found that the surface roughness of the side surface of the trench 204 after step S114 (laser annealing process) is significantly reduced compared to that before step S114 (laser annealing process), and the morphology becomes smooth.

In another aspect, the present disclosure further provides a semiconductor device that includes a semiconductor substrate and a trench manufactured in the semiconductor substrate according to the method described in any embodiment of the present disclosure.

The words "left", "right", "front", "back", "top", "bottom", "up", "down", "high", "low", etc., in the specification and claims, if present, are used for descriptive purposes and are not necessarily used to describe an unchanging relative position. It should be understood that the words used in this way are interchangeable where appropriate, so that the embodiments of the present disclosure described herein, for example, can be operated in other orientations that are different from those shown or otherwise described herein. For example, when the device in the accompanying drawings is turned over, a feature previously described as being "above" another feature may now be described as being "below" the other feature. The device may also be oriented in other ways (rotated by 90 degrees or in other orientations), and the relative spatial relationships will be interpreted accordingly.

In the specification and claims, when an element is described to be located "on", "attached" to, "connected" to, "coupled" to, "linked" to, or "in contact with" another element, and so on, the element may be directly located on, directly attached to, directly connected to, directly coupled to, directly linked to, or in direct contact with the other element, or one or more intermediate elements may be present. In contrast, when an element is described to be "directly located on", "directly attached" to, "directly connected" to, "directly coupled" to, "directly linked" to, or "in direct contact with" another element, there will be no intermediate elements. In the specification and claims, when a feature is arranged "adjacent" to another feature, it may refer to that the feature has a portion that overlaps with the adjacent feature or a portion that is above or below the adjacent feature.

As used herein, the word "exemplary" means "serving as an example, instance, or illustration", rather than serving as a "model" to be exactly copied. Any implementation described exemplarily herein is not necessarily to be construed as preferred or advantageous over other implementations. Moreover, the present disclosure is not limited by any stated or implied theory given in the technical field, background, summary, or detailed description.

As used herein, the word "substantially" is intended to include any minor variations due to design or manufacturing imperfections, device or component tolerances, environmental influences, and/or other factors. The word "substantially" also allows for deviations from a perfect or ideal situation due to parasitic effects, noise, and other practical considerations that may exist in actual implementations.

In addition, the terms "first", "second" and the like may also be used herein for reference purposes only and are not intended to be limiting. For example, the terms "first", "second" and other such numerical terms involving structures or elements do not imply a sequence or order unless the context clearly indicates otherwise.

It should also be understood that the term "include/ comprise", when used herein, indicates the presence of the specified features, integers, steps, operations, units and/or components, but does not exclude the presence or addition of one or more other features, integers, steps, operations, units and/or components and/or combinations thereof.

In this disclosure, the term "provide" is used in a broad sense to cover all ways of obtaining an object, so "providing an object" includes but is not limited to "purchasing", "preparing/manufacturing", "arranging/setting", "installing/ assembling", and/or "ordering" an object, etc.

As used herein, the term "and/or" includes any and every combination of one or more of the associated listed items. The terms used herein are for the purpose of describing specific embodiments only and are not intended to limit the present disclosure. As used herein, the singular forms "a", "an", and "the" are also intended to include the plural forms, unless the context clearly indicates otherwise.

Those skilled in the art will appreciate that the boundaries between the above operations are merely illustrative. Multiple operations can be combined into a single operation, a single operation can be distributed in additional operations, and operations can be performed at least partially overlapping in time. Moreover, alternative embodiments can include multiple instances of specific operations, and the order of operations can be changed in various other embodiments. However, other modifications, variations, and replacements are also possible. Aspects and elements of all embodiments disclosed above can be combined in any manner and/or in combination with aspects or elements of other embodiments to provide multiple additional embodiments. Therefore, this specification and accompanying drawings should be considered illustrative, not restrictive.

Although some specific embodiments of the present disclosure have been described in detail by way of examples, it should be understood by those skilled in the art that the above examples are for illustration only and are not intended to limit the scope of the present disclosure. The various embodiments disclosed herein may be combined in any manner without departing from the spirit and scope of the present disclosure. It should also be understood by those skilled in the art that various modifications may be made to the embodiments without departing from the scope and spirit of the present disclosure. The scope of the present disclosure is defined by the appended claims.

What is claimed is:

1. A method for manufacturing a trench in a semiconductor substrate, comprising:
    providing the semiconductor substrate;
    forming a hard mask layer on the semiconductor substrate, a material of the hard mask layer having a melting point higher than that of a semiconductor material of the semiconductor substrate;
    performing exposure and development after forming a photoresist pattern on the hard mask layer to etch the hard mask layer and the semiconductor substrate to form a trench in the semiconductor substrate, the trench having a side surface and a bottom surface with an angle therebetween being greater than 90 degrees, and removing the photoresist pattern;
    performing a pull-back process on the hard mask layer to expose top corners of the semiconductor substrate on both sides of the trench;
    irradiating the top corners of the semiconductor substrate on the both sides of the trench and at least one of the side surface or the bottom surface of the trench with a laser beam, such that the semiconductor material of a part of the semiconductor substrate that is at a distance from the side surface or the bottom surface of the trench not exceeding a first distance is melted, and such that the top corners of the semiconductor substrate on the both sides of the trench are rounded, wherein the hard mask layer protects the semiconductor material of a part of the semiconductor substrate that is below the hard mask layer from being melted due to the irradiation with the laser beam; and
    cooling the semiconductor substrate, such that the at least one of the side surface or the bottom surface of the trench is re-shaped to have a surface roughness lower than that before the irradiation with the laser beam,
    wherein irradiating the trench with the laser beam comprises causing a plurality of laser beams to scan the trench at a preset scanning speed in a scanning direction parallel to a length direction of the trench, the scanning being started when a preset delay period of time has elapsed from start of the irradiation, and
    wherein when causing the plurality of laser beams to scan the trench at the preset scanning speed in the scanning direction, irradiation areas of every two adjacent laser beams of the plurality of laser beams partially overlap each other in the scanning direction.

2. The method according to claim 1, wherein the laser beam is configured to irradiate the trench in an incident direction parallel to a depth direction of the trench, and an irradiation area of the laser beam is configured to cover the trench in a width direction of the trench.

3. The method according to claim 1, wherein the preset scanning speed is in a range of 100 mm/s to 500 mm/s, and the preset delay period of time is in a range of 700 ns to 900 ns.

4. The method according to claim 1, wherein the step of irradiating the trench with the laser beam is performed in an inert gas atmosphere or in a vacuum environment.

5. The method according to claim 1, wherein the first distance is in a range of 150 nm to 250 nm.

6. The method according to claim 1, wherein the semiconductor material of the semiconductor substrate comprises silicon.

7. A semiconductor device comprising a semiconductor substrate and a trench manufactured in the semiconductor substrate according to the method of claim 1.

* * * * *